(12) United States Patent
Park

(10) Patent No.: US 12,300,675 B2
(45) Date of Patent: May 13, 2025

(54) SEMICONDUCTOR PACKAGE

(71) Applicant: SAMSUNG ELECTRONICS CO., LTD., Suwon-si (KR)

(72) Inventor: Jiyoung Park, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 395 days.

(21) Appl. No.: 17/725,163

(22) Filed: Apr. 20, 2022

(65) Prior Publication Data

US 2023/0106578 A1   Apr. 6, 2023

(30) Foreign Application Priority Data

Oct. 1, 2021   (KR) .................. 10-2021-0130642

(51) Int. Cl.
*H01L 23/31*   (2006.01)
*H01L 23/498*   (2006.01)
(Continued)

(52) U.S. Cl.
CPC .......... *H01L 25/16* (2013.01); *H01L 23/3128* (2013.01); *H01L 23/49816* (2013.01);
(Continued)

(58) Field of Classification Search
CPC ......... H01L 23/00; H01L 23/31; H01L 23/50; H01L 23/498; H01L 23/538; H01L 23/5389; H01L 23/49816; H01L 23/49822; H01L 23/49833; H01L 23/49838; H01L 23/3128; H01L 24/17; H01L 25/00; H01L 25/10; H01L 25/16; H01L 25/50; H01L 25/105; H01L 28/10; H01L 28/20; H01L 28/40; H01L 21/56; H01L 21/568; H01L 21/683; H01L 21/6835; H10D 1/20;
(Continued)

(56) References Cited

U.S. PATENT DOCUMENTS 8,633,598 B1   1/2014   St. Amand
8,878,360 B2   11/2014   Meyer et al.
(Continued)

FOREIGN PATENT DOCUMENTS

KR   10-2006-0006513 A   1/2006

*Primary Examiner* — Chuong A Luu
(74) *Attorney, Agent, or Firm* — Sughrue Mion, PLLC

(57) ABSTRACT

Provided is a semiconductor package including a redistribution substrate, a semiconductor chip on a top surface of the redistribution substrate, a first passive device and a second passive device on a bottom surface of the redistribution substrate and spaced apart, connection terminals on the bottom surface of the redistribution substrate, and an underfill layer between the first passive device and the redistribution substrate and between the second passive device and the redistribution substrate, the underfill layer intersecting a region between the first passive device and the second passive device and extending in the first direction, wherein the bottom surface of the redistribution substrate is exposed between the first passive device and a first connection terminal closest to the first passive device in the first direction, and between the second passive device and a second connection terminal closest to the second passive device in an opposite direction to the first direction.

14 Claims, 15 Drawing Sheets

(51) Int. Cl.
  *H01L 25/16*      (2023.01)
  *H10D 1/20*       (2025.01)
  *H10D 1/47*       (2025.01)
  *H10D 1/68*       (2025.01)

(52) U.S. Cl.
  CPC .. *H01L 23/49822* (2013.01); *H01L 23/49833* (2013.01); *H10D 1/20* (2025.01); *H10D 1/47* (2025.01); *H10D 1/68* (2025.01)

(58) Field of Classification Search
  CPC .. H10D 1/47; H10D 1/60; H10D 1/68; H10D 30/67; H10D 30/674; H10F 10/00; H10H 20/85; H10H 20/852857; H10H 20/8585; H10H 29/85; H10H 29/852; H10H 29/0362; H10H 29/0364
  USPC ........................................................ 257/668
  See application file for complete search history.

(56) References Cited

U.S. PATENT DOCUMENTS

| | | |
|---|---|---|
| 10,128,192 B2 | 11/2018 | Lin et al. |
| 10,373,884 B2 | 8/2019 | Kim et al. |
| 10,396,047 B2 | 8/2019 | Ong et al. |
| 10,515,865 B2 | 12/2019 | Chen et al. |
| 2005/0023659 A1 | 2/2005 | Lee et al. |
| 2010/0214751 A1* | 8/2010 | Aoki ...................... H05K 1/145 361/772 |
| 2012/0005887 A1* | 1/2012 | Mortensen ........ H01L 23/49822 29/829 |
| 2018/0366423 A1* | 12/2018 | Ong .................. H01L 23/49827 |

\* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2021-0130642, filed on Oct. 1, 2021, in the Korean Intellectual Property Office, the disclosure of which is incorporated herein by reference in its entirety.

BACKGROUND

Example embodiments of the present disclosure relate to a semiconductor package, and more particularly, to a semiconductor package including an underfill layer.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the printed circuit board (PCB) through bonding wires or bumps. With the development of an electronic industry, semiconductor packages have been variously developed to reduce their sizes, weights and/or manufacturing costs. In addition, various kinds of semiconductor packages have been suggested to provide large-capacity storage devices.

SUMMARY

One or more example embodiments provide a semiconductor package with improved reliability.

According to an aspect of an example embodiment, there is provided a semiconductor package including a redistribution substrate, a semiconductor chip on a top surface of the redistribution substrate, a first passive device and a second passive device on a bottom surface of the redistribution substrate and spaced apart from each other in a first direction, connection terminals on the bottom surface of the redistribution substrate, and an underfill layer between the first passive device and the redistribution substrate and between the second passive device and the redistribution substrate, the underfill layer intersecting a region between the first passive device and the second passive device and extending in the first direction, wherein the bottom surface of the redistribution substrate is exposed between the first passive device and a first connection terminal, among the connection terminals, which is closest to the first passive device in the first direction, and between the second passive device and a second connection terminal, among the connection terminals, which is closest to the second passive device in an opposite direction to the first direction.

According to another aspect of an example embodiment, there is provided a semiconductor package including a redistribution substrate including a top surface and a bottom surface which are opposite to each other, a semiconductor chip on the top surface of the redistribution substrate, a molding layer on the semiconductor chip, a first passive device and a second passive device on the bottom surface of the redistribution substrate and spaced apart from each other in a first direction, connection terminals on the bottom surface of the redistribution substrate, and an underfill layer extending in the first direction between the first passive device and the redistribution substrate and between the second passive device and the redistribution substrate, wherein a first distance between the first passive device and the second passive device ranges from 200 μm to 600 μm, and wherein a second distance between the first passive device and a first connection terminal, among the connection terminals, which is closest to the first passive device in the first direction, ranges from 200 μm to 600 μm.

According to another aspect of an example embodiment, there is provided a semiconductor package including a redistribution substrate including an insulating layer and redistribution patterns in the insulating layer, a semiconductor chip on a top surface of the redistribution substrate, the semiconductor chip including chip pads electrically connected to the redistribution patterns, a molding layer on the semiconductor chip, a first passive device and a second passive device on a bottom surface of the redistribution substrate and spaced apart from each other in a first direction, connection terminals on the bottom surface of the redistribution substrate, pad patterns between the connection terminals and the redistribution patterns, conductive terminals between the first passive device and the bottom surface of the redistribution substrate and between the second passive device and the bottom surface of the redistribution substrate, the conductive terminals extending the first direction, and an underfill layer between the first passive device and the redistribution substrate and between the second passive device and the redistribution substrate, the underfill layer intersecting a region between the first passive device and the second passive device and extending in the first direction, wherein the bottom surface of the redistribution substrate is exposed between the first passive device and a first connection terminal, among the connection terminals, which is closest to the first passive device in the first direction, and between the second passive device and a second connection terminal, among the connection terminals, which is closest to the second passive device in an opposite direction to the first direction.

BRIEF DESCRIPTION OF THE DRAWINGS

The above and/or other aspects and features of the present disclosure will become more apparent by describing in detail example embodiments thereof with reference to the attached drawings, in which.

DETAILED DESCRIPTION

Hereinafter, embodiments will be explained in detail with reference to the accompanying drawings. Embodiments described herein are example embodiments, and the present disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
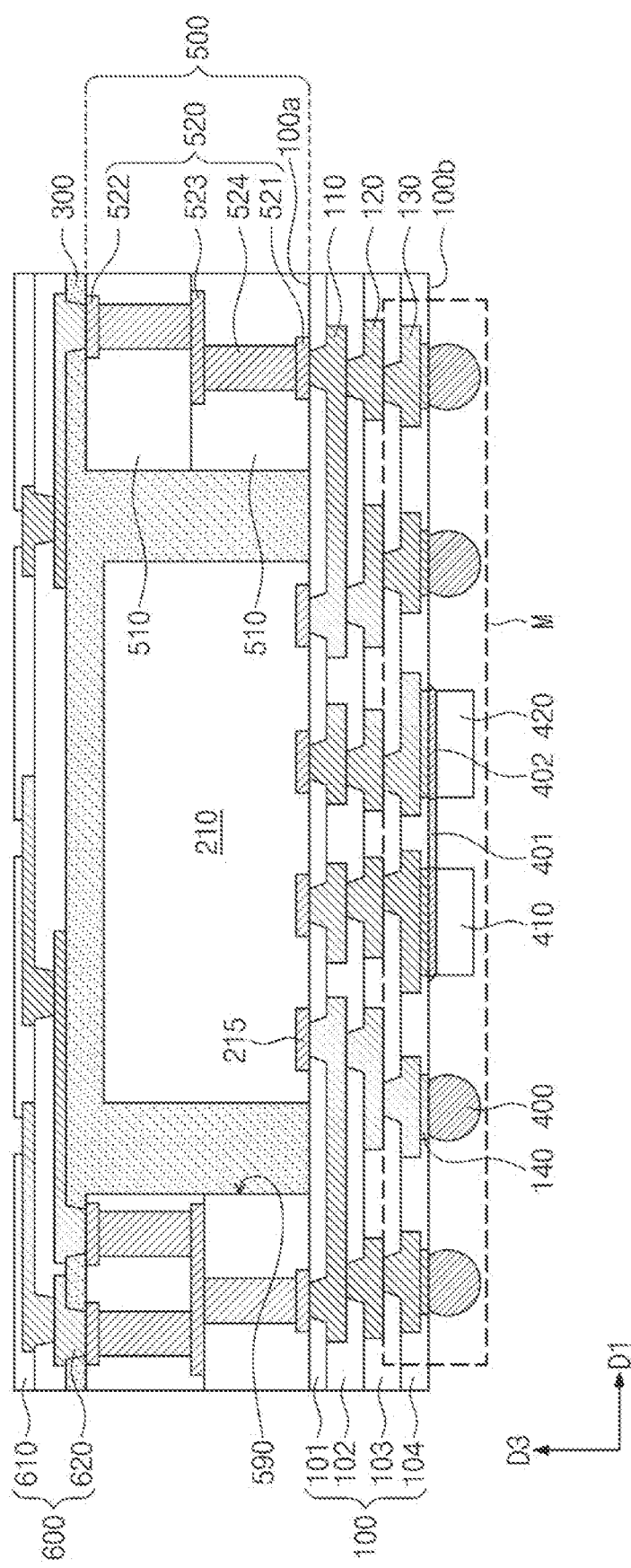
FIG. 1 is a cross-sectional view illustrating a semiconductor package according to embodiments.
Figure 2:
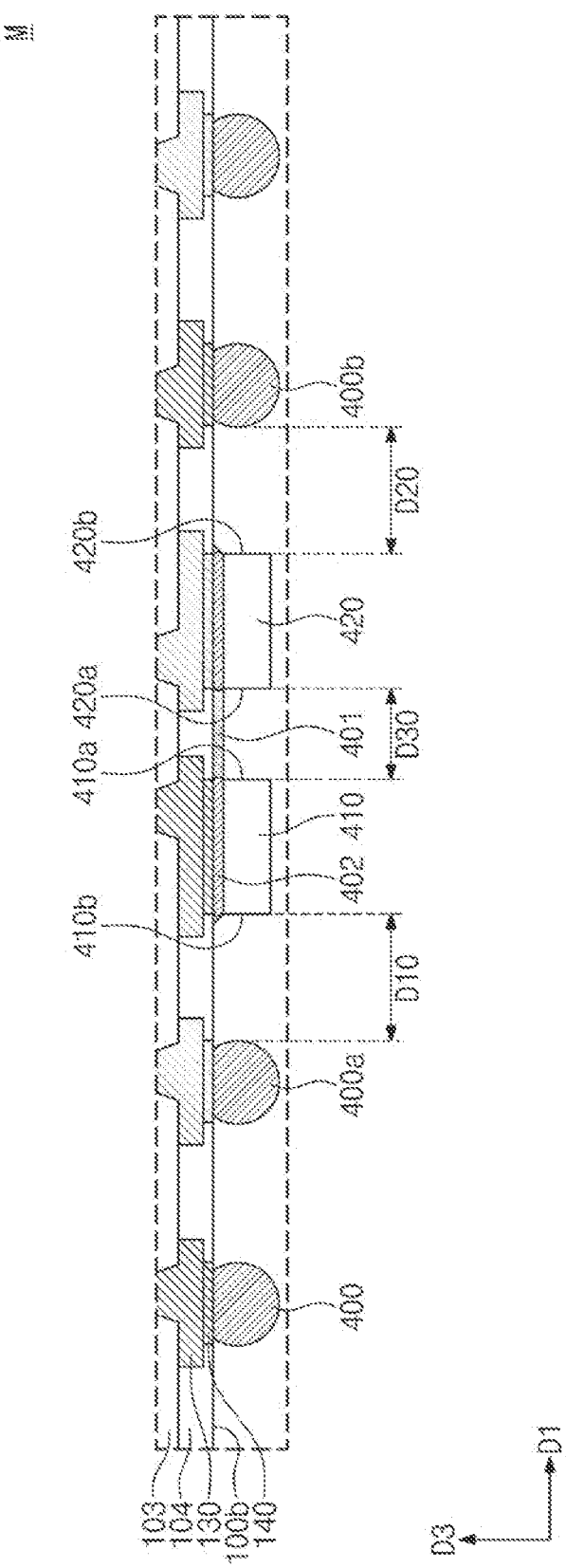
FIG. 2 is an enlarged cross-sectional view of a region 'M' of FIG. 1.
Figure 3:
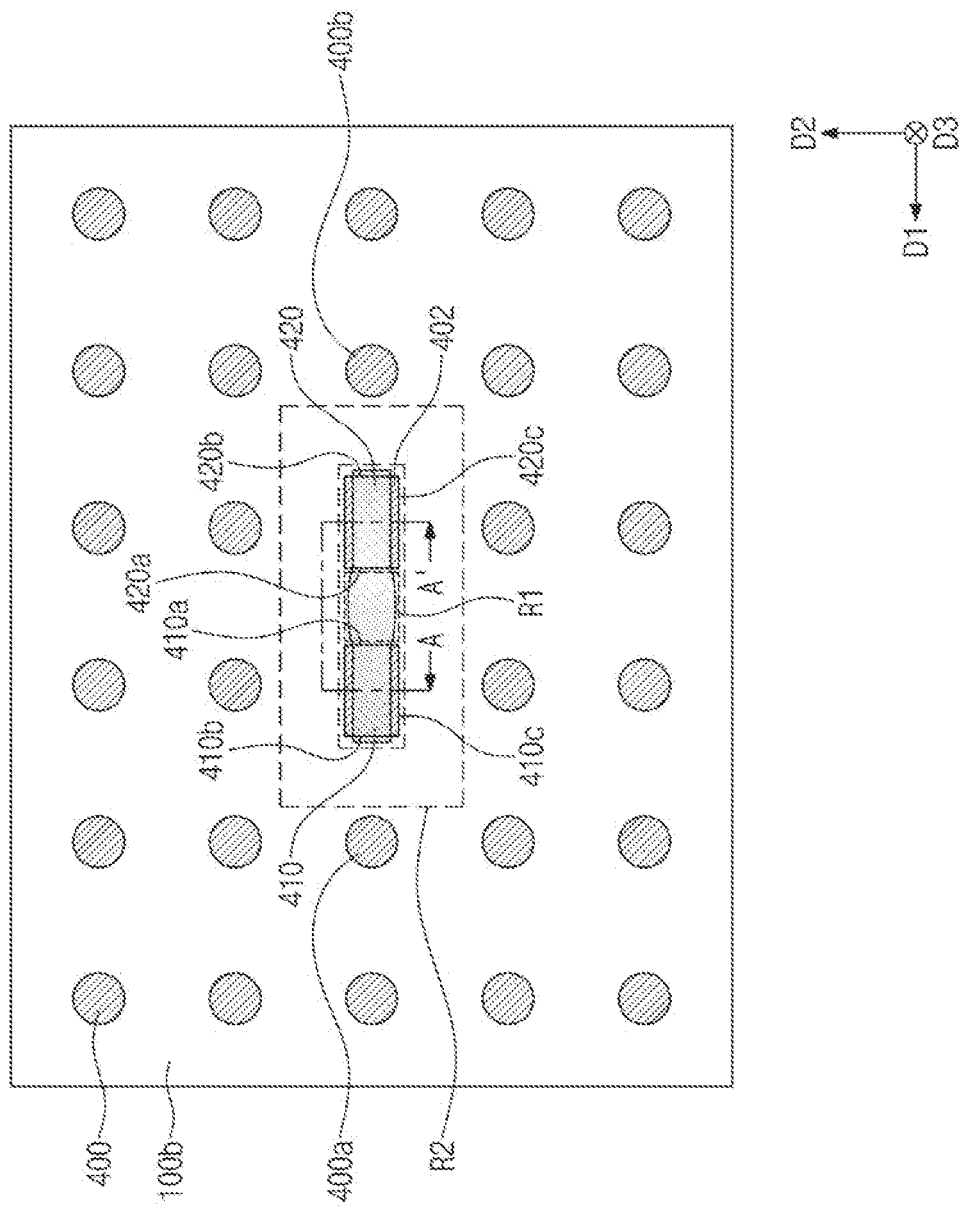
FIG. 3 is a schematic plan view illustrating a semiconductor package according to embodiments.
Figure 4:
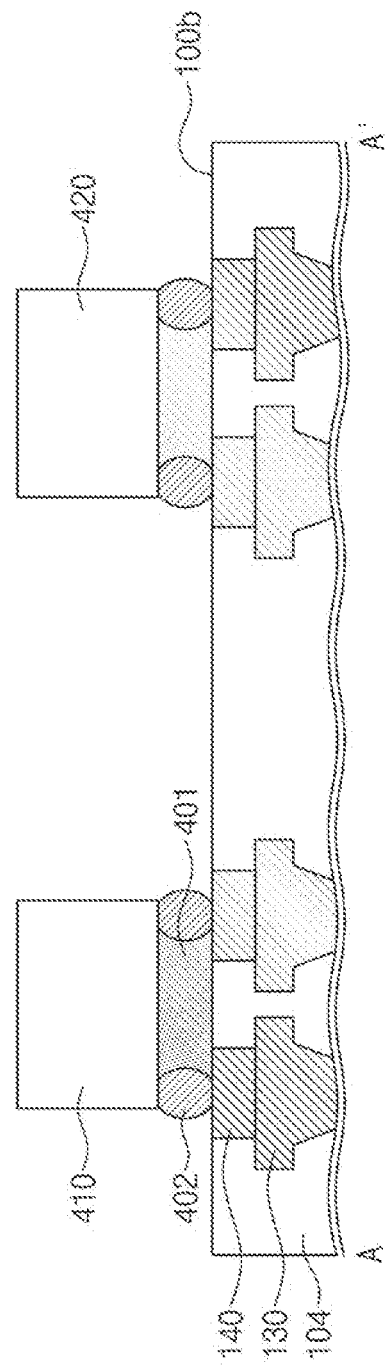
FIG. 4 is a cross-sectional view taken along a line A-A' of FIG. 3.

FIG. 1 is a cross-sectional view illustrating a semiconductor package according to embodiments. FIG. 2 is an enlarged cross-sectional view of a region 'M' of FIG. 1. FIG. 3 is a schematic plan view illustrating a semiconductor package according to embodiments. FIG. 4 is a cross-sectional view taken along a line A-A' of FIG. 3.

Referring to FIG. 1, a semiconductor package may include a redistribution substrate 100. The redistribution substrate 100 may include a first surface 100a and a second surface 100b, which are opposite to each other. The first surface 100a of the redistribution substrate 100 may be a top surface of the redistribution substrate 100. The second surface 100b of the redistribution substrate 100 may be a bottom surface of the redistribution substrate 100. The redistribution substrate 100 may include a first redistribution pattern 110, a second redistribution pattern 120, a third redistribution pattern 130, and insulating layers 101, 102, 103 and 104. The insulating layers may include a first insulating layer 101, a second insulating layer 102, a third insulating layer 103, and a fourth insulating layer 104 which are sequentially stacked. The first surface 100a of the redistribution substrate 100 may be a top surface of the first insulating layer 101. The second surface 100b of the redistribution substrate 100 may be a bottom surface of the fourth insulating layer 104. The redistribution substrate 100 may be referred to as an interconnection structure.

A semiconductor chip 210 may be mounted on the redistribution substrate 100. The semiconductor chip 210 may be provided on the first surface 100a of the redistribution substrate 100. The semiconductor chip 210 may include chip pads 215. The chip pads 215 may be adjacent to a bottom surface of the semiconductor chip 210. A bottom surface of each of the chip pads 215 may be exposed at the bottom surface of the semiconductor chip 210. In the present disclosure, when a component is referred to as being connected to the chip pad 215, the component may be connected to the semiconductor chip 210.

The first redistribution pattern 110 may be provided in the first insulating layer 101 and under the first insulating layer 101. The first redistribution pattern 110 may include a first via portion provided in the first insulating layer 101, and a first interconnection portion extending in a direction parallel to a surface of the first insulating layer 101. The first interconnection portion may be a portion provided under the first insulating layer 101. The first redistribution pattern 110 may be in contact with the chip pad 215 and/or a first pad 521 of a conductive structure 520 to be described later.

For example, the first insulating layer 101 may include an organic material (e.g., a photosensitive polymer) or a photo imageable dielectric (PID) resin. In the present disclosure, the photosensitive polymer may include at least one of for example, photosensitive polyimide, polybenzoxazole, a phenol-based polymer, or a benzocyclobutene-based polymer.

The second insulating layer 102 may be disposed under the first insulating layer 101. The second insulating layer 102 may include the same material as the first insulating layer 101. For example, the second insulating layer 102 may include an organic material (e.g., a photosensitive polymer) or a photo imageable dielectric (PID) resin. The second insulating layer 102 may be provided adjacent to and cover a side surface and a bottom surface of the first interconnection portion.

The second redistribution pattern 120 may be disposed under the first redistribution pattern 110. The second redistribution pattern 120 may be electrically connected to the first redistribution pattern 110. The second redistribution pattern 120 may be provided in the second insulating layer 102 and under the second insulating layer 102. The second redistribution pattern 120 may include a second via portion provided in the second insulating layer 102, and a second interconnection portion extending in a direction parallel to a surface of the second insulating layer 102. The second interconnection portion may be a portion provided under the second insulating layer 102.

The third insulating layer 103 may be disposed under the second insulating layer 102. The third insulating layer 103 may include the same material as the first insulating layer 101. For example, the third insulating layer 103 may include an organic material (e.g., a photosensitive polymer) or a photo imageable dielectric (PID) resin. The third insulating layer 103 may be provided adjacent to and cover a side surface and a bottom surface of the second interconnection portion.

The third redistribution pattern 130 may be disposed under the second redistribution pattern 120. The third redistribution pattern 130 may be electrically connected to the second redistribution pattern 120. The third redistribution pattern 130 may be provided in the third insulating layer 103 and under the third insulating layer 103. The third redistribution pattern 130 may include a third via portion provided in the third insulating layer 103, and a third interconnection portion extending in a direction parallel to a surface of the third insulating layer 103. The third interconnection portion may be a portion provided under the third insulating layer 103.

The fourth insulating layer 104 may be disposed under the third insulating layer 103. The fourth insulating layer 104 may include the same material as the first insulating layer 101. For example, the fourth insulating layer 104 may include an organic material (e.g., a photosensitive polymer) or a photo imageable dielectric (PID) resin. However, embodiments are not limited thereto. For example, the fourth insulating layer 104 may include a different material from that of the first insulating layer 101. For example, the fourth insulating layer 104 may include a material having high spreadability, such as an Ajinomoto build-up film (ABF) or an epoxy-based polymer. The fourth insulating layer 104 may be provided adjacent to and cover a side surface and a bottom surface of the third interconnection portion.

Pad patterns 140 may be disposed under the third redistribution pattern 130. The pad patterns 140 may be provided in the fourth insulating layer 104. A bottom surface of each of the pad patterns 140 may be exposed at the second surface 100b of the redistribution substrate 100. Each of the pad patterns 140 may function as a pad of a connection terminal 400 or conductive terminal 402 to be described later.

Each of the first to third redistribution patterns 110, 120 and 130 and the pad patterns 140 may include copper (Cu), titanium (Ti), tin (Sn), aluminum (Al), or any combination thereof.

A connection substrate 500 may be disposed on the first surface 100a of the redistribution substrate 100. The connection substrate 500 may have a cavity region 590 penetrating the connection substrate 500. For example, the connection substrate 500 may be manufactured by forming the cavity region 590 penetrating a top surface and a bottom surface of a printed circuit board. The cavity region 590 may be formed in a center portion of the redistribution substrate 100 when viewed in a plan view. The semiconductor chip 210 may be disposed in the cavity region 590 of the connection substrate 500. The semiconductor chip 210 may be spaced apart from an inner side surface of the connection substrate 500.

The connection substrate 500 may include a base layer 510 and a conductive structure 520. The base layer 510 may include a plurality of stacked base layers 510. The base layer 510 may include an insulating material. For example, the base layer 510 may include a carbon-based material, a ceramic, or a polymer. The cavity region 590 may be provided to penetrate the base layers 510. The conductive structure 520 may be provided in the base layers 510. The conductive structure 520 may include a first pad 521, a conductive interconnection line 523, vias 524, and a second pad 522. The first pad 521 may be exposed at a bottom surface of the connection substrate 500. The conductive interconnection line 523 may be disposed between the base layers 510. The vias 524 may penetrate the base layers 510 to be connected to the conductive interconnection line 523. The second pad 522 may be exposed at a top surface of the connection substrate 500 and may be connected to one of the vias 524. The second pad 522 may be electrically connected to the first pad 521 through the vias 524 and the conductive interconnection line 523. The second pad 522 may not be vertically aligned with the first pad 521. The number of the second pad 522 may be different from the number of the first pad 521. The conductive structure 520 may include a metal. For example, the conductive structure 520 may include at least one of copper (Cu), aluminum (Al), tungsten (W), titanium (Ti), tantalum (Ta), iron (Fe), or any alloy thereof.

A molding layer 300 may be provided on the semiconductor chip 210 and the connection substrate 500. The molding layer 300 may cover the semiconductor chip 210 and the connection substrate 500. The molding layer 300 may be provided adjacent to and cover a side surface and a top surface of the semiconductor chip 210. The molding layer 300 may be disposed between the semiconductor chip 210 and the connection substrate 500. In embodiments, an adhesive insulating film may be adhered onto a top surface of the connection substrate 500, the top surface of the semiconductor chip 210 and the side surface of the semiconductor chip 210 to form the molding layer 300. For example, an Ajinomoto build-up film (ABF) may be used as the adhesive insulating film, however, embodiments are not limited thereto. For example, the molding layer 300 may include an insulating polymer such as an epoxy-based polymer.

An upper redistribution layer 600 may be disposed on the molding layer 300 and the connection substrate 500. The upper redistribution layer 600 may include upper insulating patterns 610 and upper redistribution patterns 620. The upper insulating patterns 610 may be stacked on the molding layer 300. The upper insulating patterns 610 may include an organic material (e.g., a photosensitive polymer) or a photo imageable dielectric (PID) resin. At least one of the upper redistribution patterns 620 may include a via portion in a corresponding one of the upper insulating patterns 610 and an interconnection portion extending in parallel to a surface of the corresponding upper insulating pattern 610. At least another of the upper redistribution patterns 620 may extend into the molding layer 300 to be connected to the second pad 522.

Connection terminals 400 may be disposed on the second surface 100b of the redistribution substrate 100. The connection terminal 400 may be disposed on the bottom surface of the pad pattern 140 and may be in direct contact with the pad pattern 140. Thus, the connection terminal 400 may be electrically connected to the semiconductor chip 210 through the first to third redistribution patterns 110, 120 and 130. The connection terminal 400 may include a solder, a bump, a pillar, and/or any combination thereof. The connection terminal 400 may include a solder material.

A first passive device 410 and a second passive device 420 may be disposed on the second surface 100b of the redistribution substrate 100. The first passive device 410 and the second passive device 420 may be spaced apart from each other in a first direction D1. Each of the first passive device 410 and the second passive device 420 may be a capacitor, an inductor, or a resistor. For example, each of the first passive device 410 and the second passive device 420 may be the capacitor.

Heights of the first and second passive devices 410 and 420 may be substantially equal to each other. The height of the first passive device 410 may be a vertical distance between a top surface and a bottom surface of the first passive device 410. The height of the second passive device 420 may be a vertical distance between a top surface and a bottom surface of the second passive device 420. A height of the connection terminal 400 may be greater than the height of each of the first passive device 410 and the second passive device 420. The height of the connection terminal 400 may be substantially equal to a vertical distance from a lowermost portion of the connection terminal 400 to the second surface 100b of the redistribution substrate 100. In other embodiments, the heights of the first and second passive devices 410 and 420 may be different from each other.

Referring to FIGS. 1 to 4, an underfill layer 401 may be disposed between the first passive device 410 and the second surface 100b of the redistribution substrate 100 and between the second passive device 420 and the second surface 100b of the redistribution substrate 100. The underfill layer 401 may include a material having high spreadability, such as an Ajinomoto build-up film (ABF) or an epoxy-based polymer. Since the underfill layer 401 is provided, it is possible to prevent a crack from occurring in the passive devices having relatively thin thicknesses.

Conductive terminals 402 may be disposed between the first passive device 410 and the pad patterns 140 and between the second passive device 420 and the pad patterns 140. The conductive terminals 402 may be in direct contact with the pad patterns 140. The first and second passive devices 410 and 420 may be electrically connected to the redistribution substrate 100 through the conductive terminals 402. Each of the conductive terminals 402 may have a shape elongated in the first direction D1. The conductive terminals 402 may include a conductive metal material.

When viewed in a plan view, a region between the first passive device 410 and the second passive device 420 may be defined as a first region R1 (see FIG. 3). The underfill layer 401 may extend in the first direction D1 and may intersect the first region R1. In other words, the first passive device 410 and the second passive device 420 may share the underfill layer 401. The underfill layer 401 may be disposed between the conductive terminals 402 connected to the first passive device 410. In addition, the underfill layer 401 may be disposed between the conductive terminals 402 connected to the second passive device 420 (see FIGS. 3 and 4).

Each of the first passive device 410 and the second passive device 420 may include a first surface 410*a* or 420*a* extending in a second direction D2, a second surface 410*b* or 420*b* opposite to the first surface 410*a* or 420*a*, and third surfaces 410*c* or 420*c* extending in the first direction D1. The first surface 410*a* of the first passive device 410 may face the first surface 420*a* of the second passive device 420. The first surface 410*a* of the first passive device 410 and the first surface 420*a* of the second passive device 420 may be adjacent to the first region R1. The third surfaces 410*c* of the first passive device 410 may be opposite to each other. The third surfaces 420*c* of the second passive device 420 may be opposite to each other. Each of the conductive terminals 402 may be adjacent to the third surface 410*c* or 420*c* of the first passive device 410 or the second passive device 420 and may extend along it in the first direction D1. In embodiments, by the conductive terminals 402, the underfill layer 401 may be horizontally offset from the third surfaces 410*c* or 420*c* of each of the first passive device 410 and the second passive device 420 in the second direction D2. The underfill layer 401 may extend from the second surface 410*b* of the first passive device 410 to the second surface 420*b* of the second passive device 420 in the first direction D1. Side surfaces of the underfill layer 401 may be exposed by the second surface 410*b* of the first passive device 410 and the second surface 420*b* of the second passive device 420.

The first surface 410*a* and the second surface 410*b* of the first passive device 410 may have substantially the same width. The first surface 420*a* and the second surface 420*b* of the second passive device 420 may have substantially the same width. A width of each of the third surfaces 410*c* of the first passive device 410 may be greater than the width of the first surface 410*a*. A width of each of the third surfaces 420*c* of the second passive device 420 may be greater than the width of the first surface 420*a*.

A distance between the first passive device 410 and a first connection terminal 400*a* among the connection terminals 400, which is closest to the first passive device 410 in the first direction D1 may be defined as a first distance D10. For example, the first distance D10 may range from 200 μm to 600 μm. A distance between the second passive device 420 and a second connection terminal 400*b* among the connection terminals 400, which is closest to the second passive device 420 in an opposite direction to the first direction D1 may be defined as a second distance D20. The second distance D20 may be substantially equal to the first distance D10. For example, the second distance D20 may range from 200 μm to 600 μm. However, embodiments are not limited thereto, and in embodiments, the second distance D20 may be different from the first distance D10.

A distance between the first passive device 410 and the second passive device 420 may be defined as a third distance D30. For example, the third distance D30 may range from 200 μm to 600 μm. The third distance D30 may be substantially equal to a width of the first region R1 in the first direction D1.

The second surface 100*b* of the redistribution substrate 100 may be fully exposed between the first passive device 410 and the first connection terminal 400*a* closest to the first passive device 410 in the first direction D1. The second surface 100*b* of the redistribution substrate 100 may be fully exposed between the second passive device 420 and the second connection terminal 400*b* closest to the second passive device 420 in the opposite direction to the first direction D1.

A second region R2 which is adjacent to and surrounds the first region R1, the first passive device 410 and the second passive device 420 and is adjacent to and surrounded by the connection terminals 400 may be defined when viewed in a plan view (see FIG. 3). The second surface 100*b* of the redistribution substrate 100 corresponding to the second region R2 may be fully exposed. For example, a component may not be provided on the second surface 100*b* of the redistribution substrate 100 in the second region R2. The underfill layer 401 may not extend into the second region R2.

Figure 5:
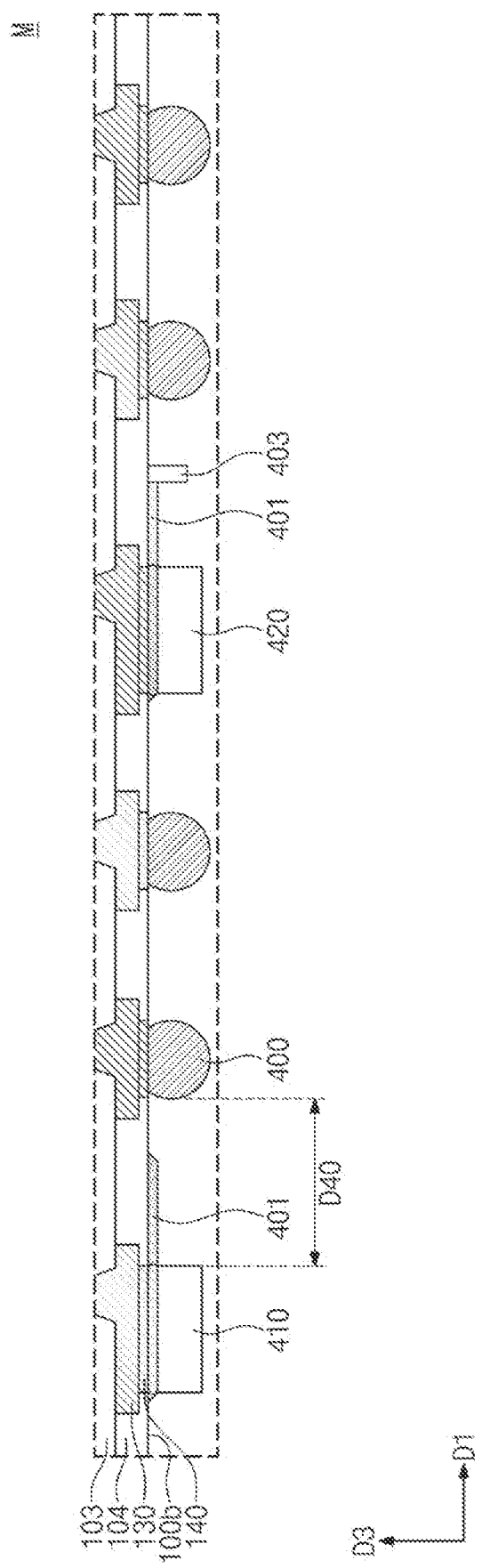
FIG. 5 is an enlarged cross-sectional view corresponding to the region 'M' of FIG. 1 to illustrate a semiconductor package according to a related example.

FIG. 5 is an enlarged cross-sectional view corresponding to the region 'M' of FIG. 1 to illustrate a semiconductor package according to a related example.

Referring to FIG. 5, an underfill layer 401 may be provided in plurality. For example, a first passive device 410 and a second passive device 420 may not share a single underfill layer 401. A plurality of connection terminals 400 may be disposed between the first passive device 410 and the second passive device 420. A distance between the first passive device 410 and a connection terminal 400 closest to the first passive device 410 may be defined as a fourth distance D40. The fourth distance D40 may be greater than the first distance D10. The underfill layer 401 including a material having high spreadability may extend to the connection terminal 400 to come in contact with the connection terminal 400. In this case, when a semiconductor package is mounted on a board, the connection terminal being in contact with the underfill layer may not be connected to the board. To prevent this, the fourth distance D40 may be relatively great. Accordingly, a size and an area of the redistribution substrate 100 may be increased. According to the related example, it may be difficult to miniaturize a semiconductor package.

According to the embodiments (see FIGS. 1 to 4), the first and second passive devices 410 and 420 adjacent to each other in the first direction D1 may share the underfill layer 401. Thus, even though the underfill layer 401 including the material having the high spreadability is used, the distances between the first and second passive devices 410 and 420 and the connection terminals 400 closest thereto may be reduced. As a result, it may be easier to miniaturize the semiconductor package. In addition, in the case in which the distances between the first and second passive devices 410 and 420 and the connection terminals 400 closest thereto are reduced, the underfill layer 401 may extend along the first passive device 410 and the second passive device 420, and thus the connection terminals 400 may not be in contact with the underfill layer 401, thereby preventing the failure in the related example. As a result, electrical characteristics of the semiconductor package may be improved.

Referring again to FIG. 5, a spacer 403 may be disposed between the second passive device 420 and the connection terminal 400 closest thereto. Since the spacer 403 is provided, it is possible to prevent the underfill layer 401 including the material having the high spreadability from extending to come in contact with the connection terminal 400. However, according to the related example, a process of forming the spacer 403 may be added in processes of manufacturing a semiconductor package, and thus the number of the manufacturing processes may be increased. In addition, since the underfill layer 401 is formed under each of the first passive device 410 and the second passive device 420, the number of processes of discharging the underfill layer 401 may increase as the number of the passive devices increases, and thus it may be difficult to simplify the manufacturing processes.

According to the embodiments (see FIGS. 1 to 4), the second surface 100b of the redistribution substrate 100 corresponding to the second region R2 may be fully exposed. For example, even though the process of forming a component such as the spacer 403 is not added, it is possible to prevent the underfill layer 401 from being in contact with the connection terminal 400. In addition, since the first passive device 410 and the second passive device 420 are disposed adjacent to each other, an underfill material may be discharged into a region between the first passive device 410 and the second passive device 420, and thus the first and second passive devices 410 and 420 may share a single underfill layer 401. For example, according to the embodiments, the number of processes of discharging the underfill layer 401 may be reduced in processes of manufacturing the semiconductor package. As a result, the processes of manufacturing the semiconductor package may be more simplified.

Figure 6:
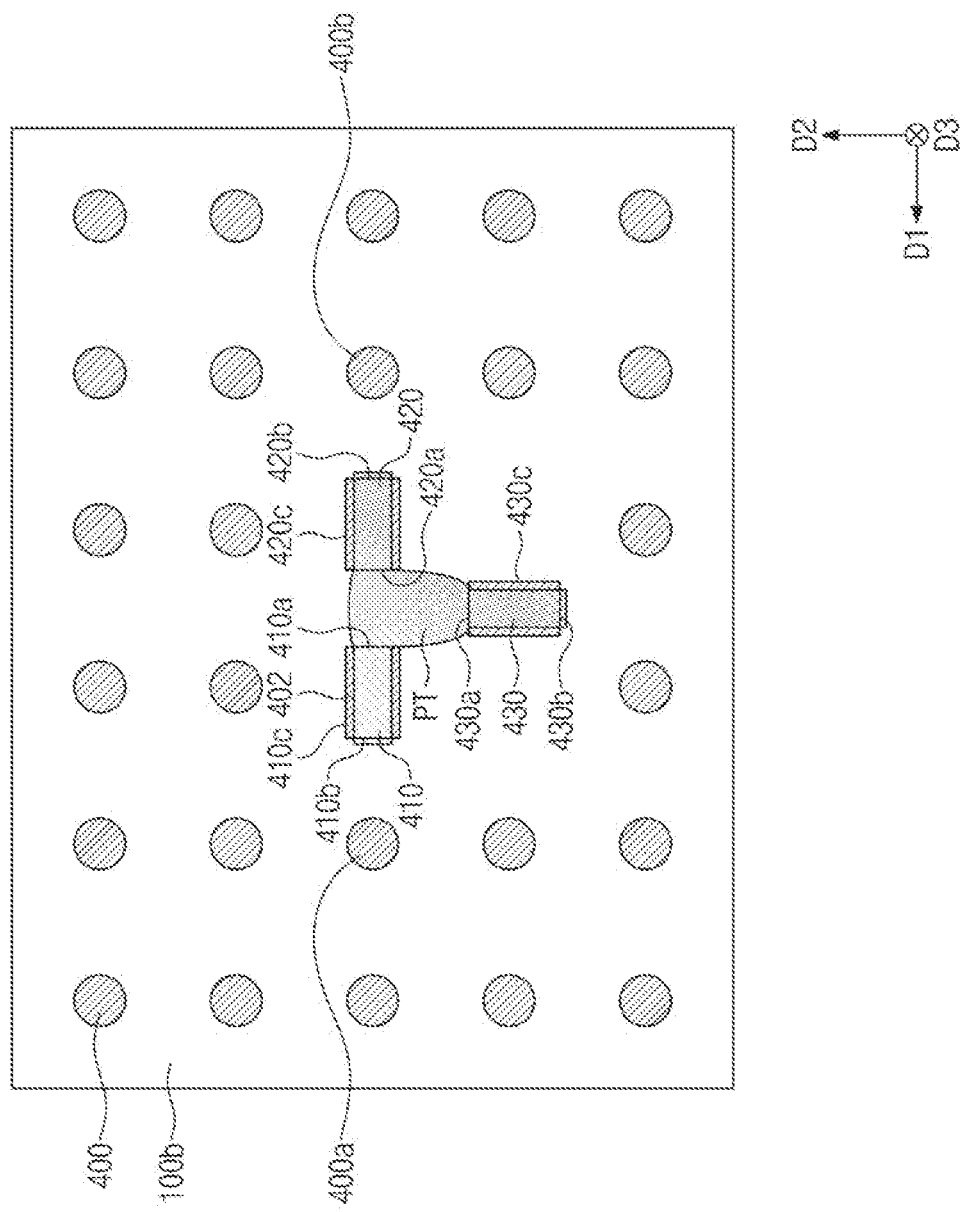
FIG. 6 is a schematic plan view illustrating a semiconductor package according to embodiments.

FIG. 6 is a schematic plan view illustrating a semiconductor package according to embodiments. In the embodiments, for the purpose of ease and convenience in explanation, the descriptions to the same features and/or components as in the embodiments of FIGS. 1 to 4 will be omitted and differences between the embodiments and the embodiments of FIGS. 1 to 4 will be mainly described.

Referring to FIG. 6, a third passive device 430 may be disposed on the second surface 100b of the redistribution substrate 100. The third passive device 430 may be spaced apart from the first passive device 410 and the second passive device 420 in the second direction D2. The third passive device 430 may include a first surface 430a facing the first passive device 410 and the second passive device 420 and extending in the first direction D1, a second surface 430b opposite to the first surface 430a of the third passive device 430, and third surfaces 430c extending in the second direction D2. The conductive terminals 402 may be disposed between the third passive device 430 and the second surface 100b of the redistribution substrate 100. The conductive terminals 402 disposed between the third passive device 430 and the redistribution substrate 100 may be adjacent to the third surfaces 430c of the third passive device 430 and may be elongated along the third surfaces 430c in the second direction D2.

The underfill layer 401 may further include a protrusion PT extending in the second direction D2. The protrusion PT may be a portion of the underfill layer 401, which extends toward the third passive device 430. The protrusion PT may be disposed between the third passive device 430 and the redistribution substrate 100. The protrusion PT may be disposed between the conductive terminals 402 disposed between the third passive device 430 and the redistribution substrate 100. The protrusion PT may be horizontally offset from the third surfaces 430c of the third passive device 430.

According to the embodiments, the single underfill layer 401 may be shared by the first to third passive devices 410, 420 and 430. For example, an underfill material may be discharged into a region adjacent to the first surfaces 410a, 420a and 430a of the first to third passive devices 410, 420 and 430 to form the underfill layer 401. As a result, processes of manufacturing the semiconductor package may be more simplified.

Figure 7:
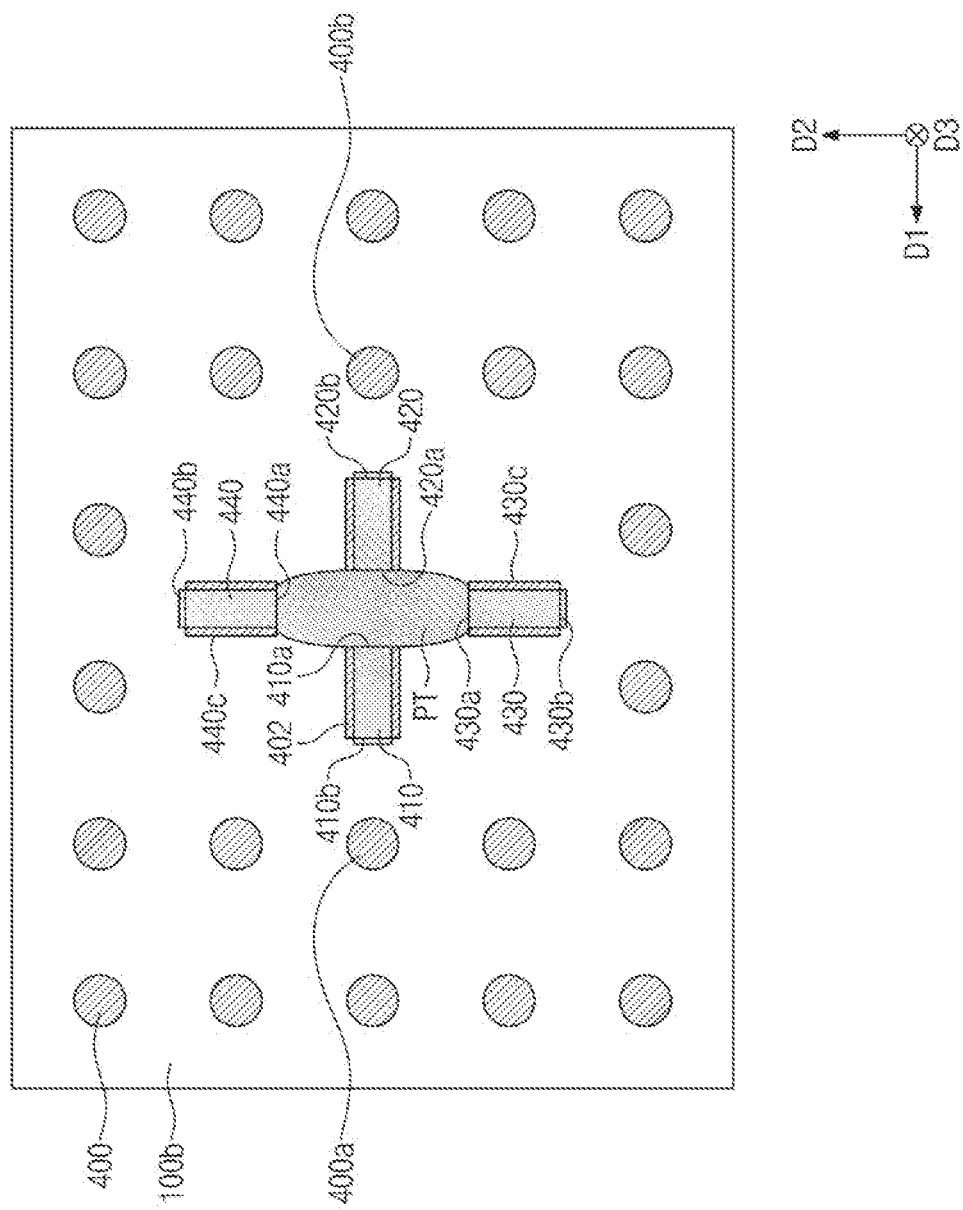
FIG. 7 is a schematic plan view illustrating a semiconductor package according to embodiments.

FIG. 7 is a schematic plan view illustrating a semiconductor package according to embodiments. In the embodiments, for the purpose of ease and convenience in explanation, the descriptions to the same features and/or components as in the embodiments of FIGS. 1 to 4 and 6 will be omitted and differences between the embodiments and the embodiments of FIGS. 1 to 4 and 6 will be mainly described.

Referring to FIG. 7, a fourth passive device 440 may be disposed on the second surface 100b of the redistribution substrate 100. The fourth passive device 440 may be spaced apart from the first passive device 410 and the second passive device 420 in the second direction D2. The fourth passive device 440 may be spaced apart from the third passive device 430 in the second direction D2. The fourth passive device 440 may face the third passive device 430 in the second direction D2.

The fourth passive device 440 may include a first surface 440a facing the first passive device 410 and the second passive device 420 and extending in the first direction D1, a second surface 440b opposite to the first surface 440a of the fourth passive device 440, and third surfaces 440c extending in the second direction D2. The conductive terminals 402 may be disposed between the fourth passive device 440 and the second surface 100b of the redistribution substrate 100. The conductive terminals 402 disposed between the fourth passive device 440 and the redistribution substrate 100 may be adjacent to the third surfaces 440c of the fourth passive device 440 and may be elongated along the third surfaces 440c in the second direction D2.

The underfill layer 401 may further include a protrusion PT extending in the second direction D2. The protrusion PT may be a portion of the underfill layer 401, which extends toward the third passive device 430 and the fourth passive device 440. The protrusion PT may be disposed between the fourth passive device 440 and the redistribution substrate 100. The protrusion PT may be disposed between the conductive terminals 402 disposed between the fourth passive device 440 and the redistribution substrate 100. The protrusion PT may be horizontally offset from the third surfaces 440c of the fourth passive device 440.

According to the embodiments, the single underfill layer 401 may be shared by the first to fourth passive devices 410, 420, 430 and 440. For example, an underfill material may be discharged into a region adjacent to the first surfaces 410a, 420a, 430a and 440a of the first to fourth passive devices 410, 420, 430 and 440 to form the underfill layer 401. As a result, processes of manufacturing the semiconductor package may be more simplified.

FIGS. 8A to 8F are cross-sectional views illustrating a method of manufacturing a semiconductor package according to embodiments.

Figure 8A:
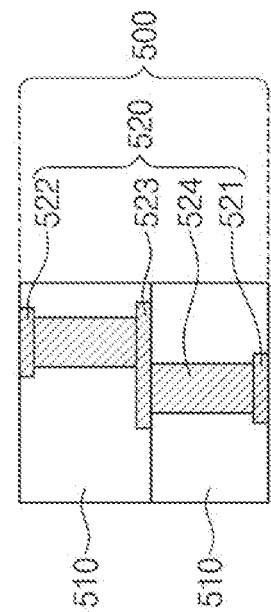
FIGS. 8A, 8B, 8C, 8D, 8E, and 8F are cross-sectional views illustrating a method of manufacturing a semiconductor package according to embodiments.
Figure 8A:
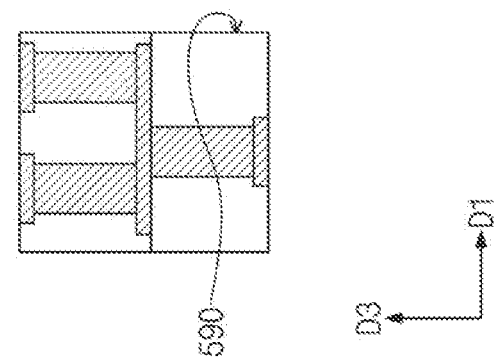

Referring to FIG. 8A, a connection substrate 500 may be provided. The connection substrate 500 may include base layers 510 and a conductive structure 520 in the base layers 510. For example, a printed circuit board may be used as the connection substrate 500. The conductive structure 520 may include a first pad 521, a conductive interconnection line 523, vias 524, and a second pad 522. The first pad 521 may be exposed at a bottom surface of the connection substrate 500. The conductive interconnection line 523 may be disposed between the base layers 510. The vias 524 may penetrate the base layers 510 to be connected to the conductive interconnection line 523. The second pad 522 may be exposed at a top surface of the connection substrate 500 and may be connected to one of the vias 524. The second pad 522 may be electrically connected to the first pad 521 through the vias 524 and the conductive interconnection line 523.

A cavity region 590 may be formed in the connection substrate 500. The cavity region 590 may be formed by removing a partial region of the connection substrate 500 and thus may penetrate the connection substrate 500. For example, a process of forming the cavity region 590 may be performed by an etching process such as a drilling process, a laser ablation process, or a laser cutting process. The removed region of the connection substrate 500 may be a space in which a semiconductor chip 210 will be provided in a subsequent process.

Figure 8B:
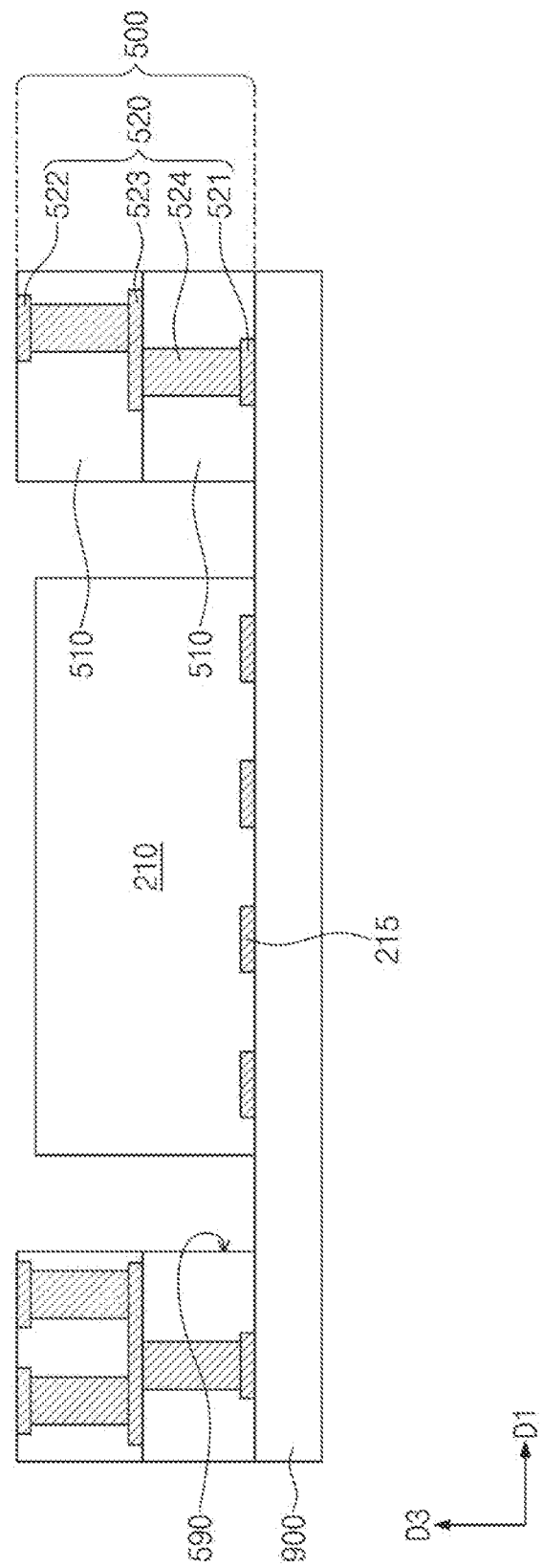

Referring to FIG. 8B, the connection substrate 500 may be adhered onto a first carrier substrate 900. For example, the first carrier substrate 900 may be an insulating substrate including glass or polymer, or a conductive substrate including a metal. For example, the first carrier substrate 900 may be adhered to the connection substrate 500 by an adhesive member provided on a top surface of the first carrier substrate 900. For example, the adhesive member may include an adhesive tape.

A semiconductor chip 210 may be disposed on the first carrier substrate 900. The semiconductor chip 210 may be disposed in the cavity region 590 of the connection substrate 500. The semiconductor chip 210 may be spaced apart from an inner side surface of the connection substrate 500. The semiconductor chip 210 may be adhered onto the first carrier substrate 900. The semiconductor chip 210 may include chip pads 215 disposed in its lower portion.

Figure 8C:
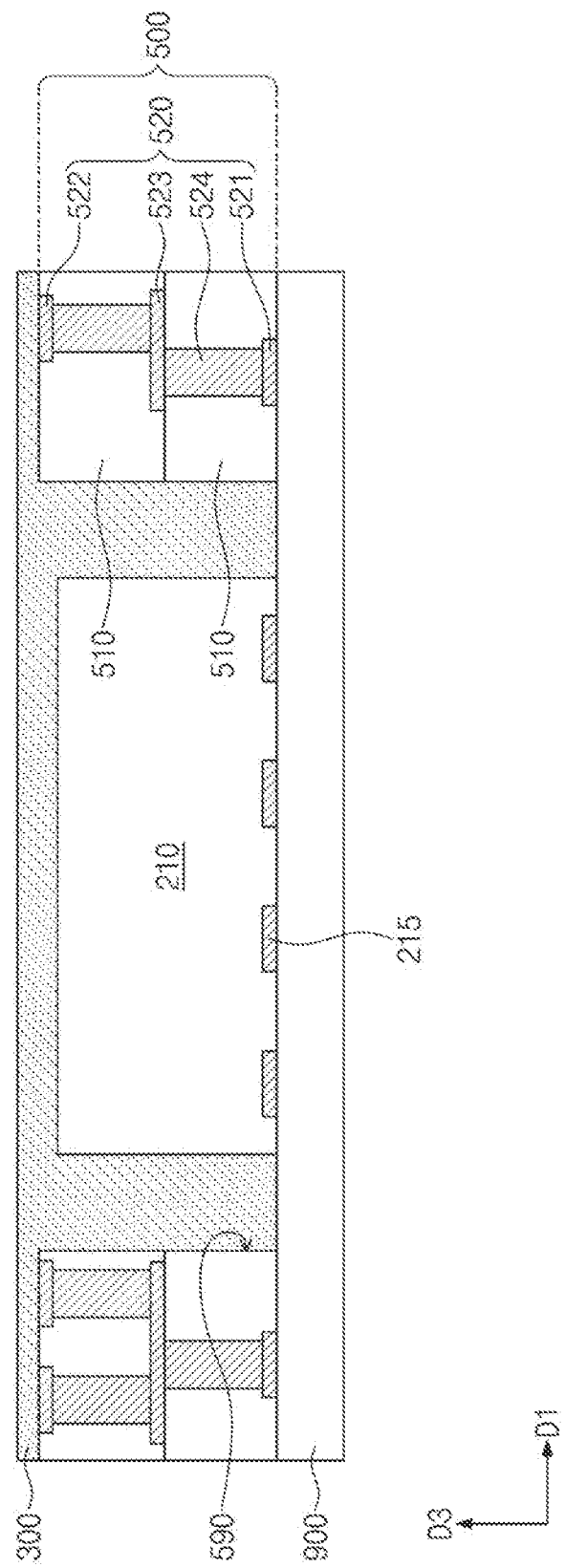

Referring to FIG. 8C, a molding layer 300 may be formed on the first carrier substrate 900. The molding layer 300 may cover a top surface of the connection substrate 500 and a top surface of the semiconductor chip 210. The molding layer 300 may be disposed between the connection substrate 500 and the semiconductor chip 210. For example, the molding layer 300 may fill a remaining portion of the cavity region 590. The molding layer 300 may include an Ajinomoto build-up film (ABF). According to another embodiment, the molding layer 300 may include an insulating polymer.

Figure 8D:
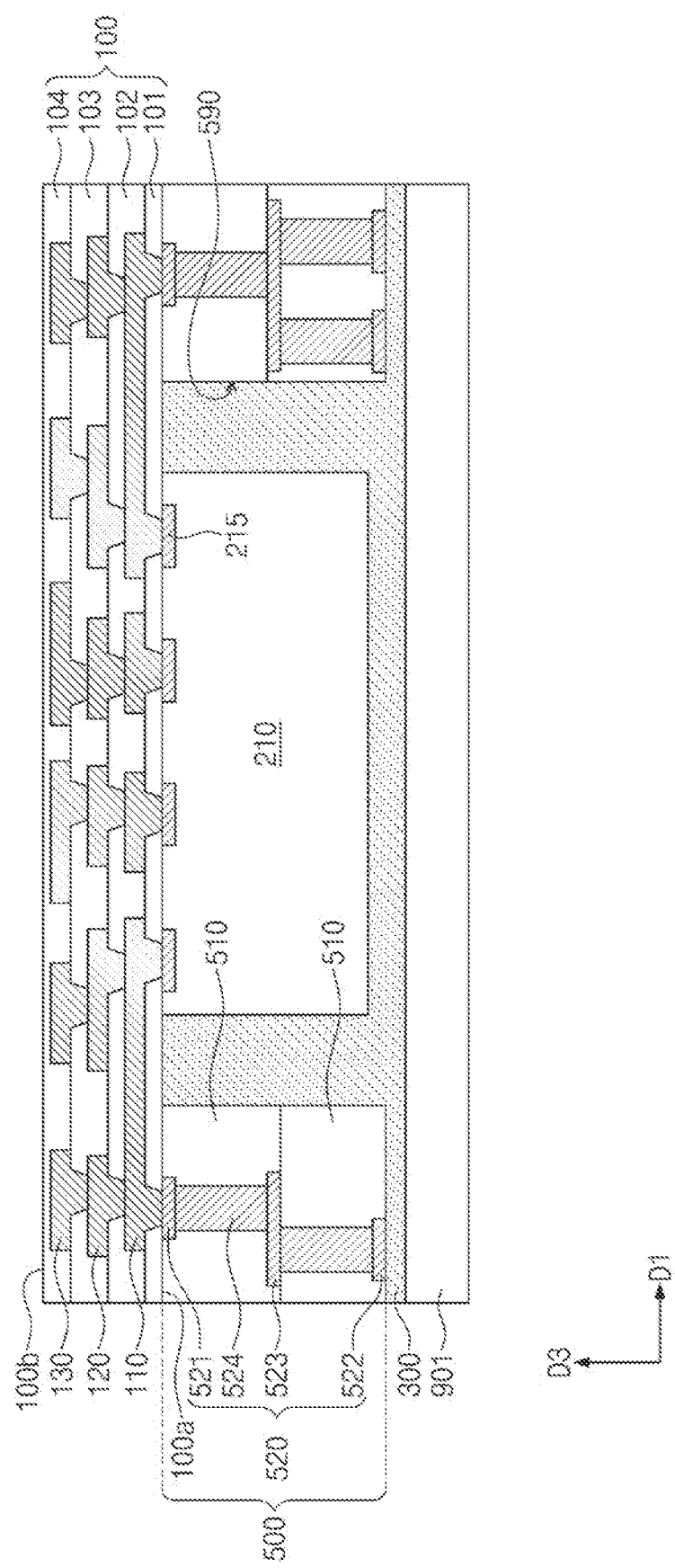

Referring to FIG. 8D, a structure obtained by removing the first carrier substrate 900 from the resultant structure of FIG. 8C may be flipped and then may be disposed on a second carrier substrate 901. The second carrier substrate 901 may be an insulating substrate or a conductive substrate. The second carrier substrate 901 may be in contact with the molding layer 300.

A redistribution substrate 100 may be formed on the semiconductor chip 210, the molding layer 300 and the connection substrate 500. The formation of the redistribution substrate 100 may include forming a first insulating layer 101, forming holes penetrating the first insulating layer 101, forming a first redistribution pattern 110 on the first insulating layer 101, forming a second insulating layer 102 covering the first redistribution pattern 110, forming holes penetrating a portion of the second insulating layer 102, forming a second redistribution pattern 120 on the first redistribution pattern 110, forming a third insulating layer 103 covering the second redistribution pattern 120, forming holes penetrating a portion of the third insulating layer 103, forming a third redistribution pattern 130 on the second redistribution pattern 120, and forming a fourth insulating layer 104 covering the third redistribution pattern 130.

Figure 8E:
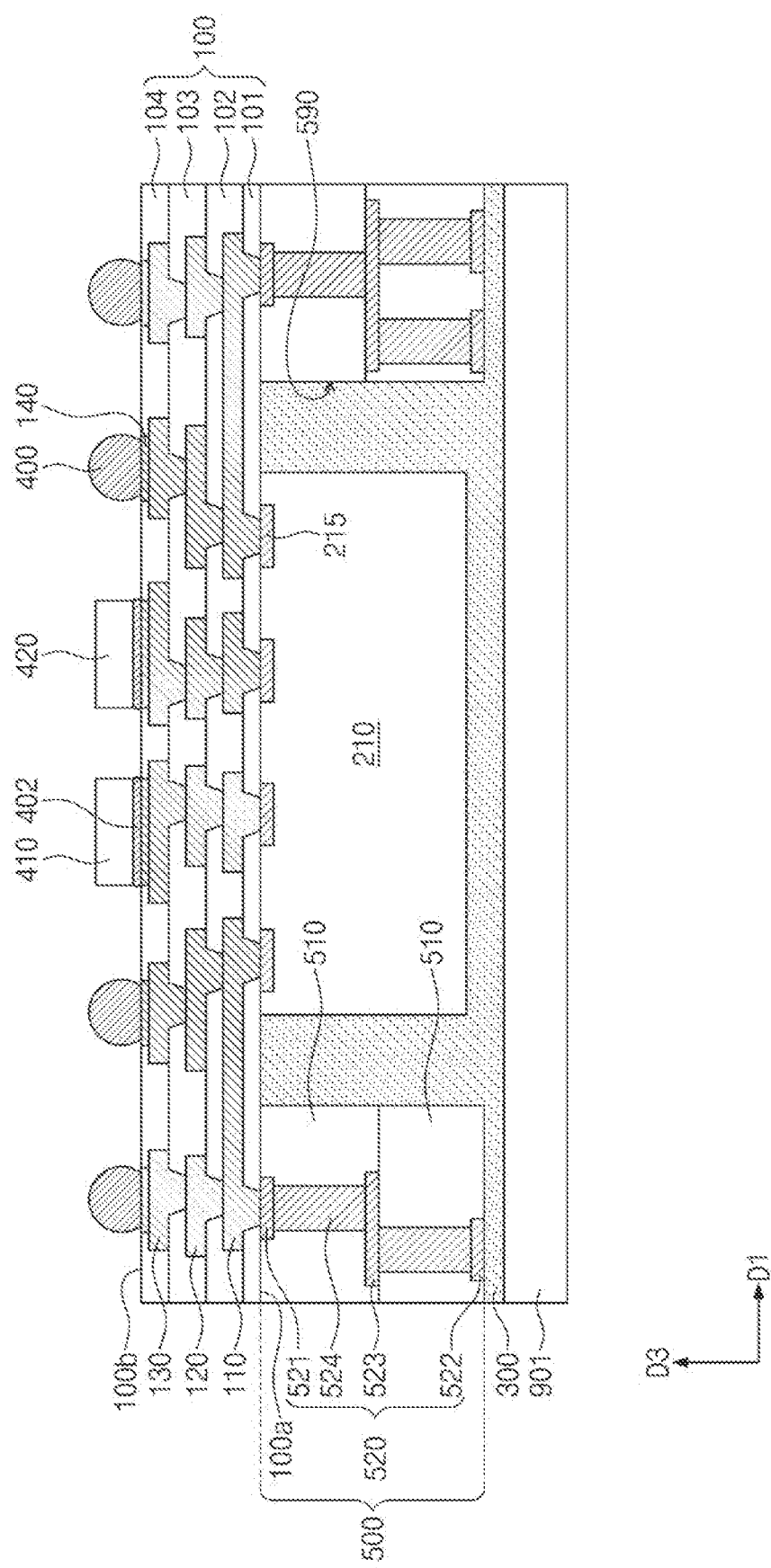

Referring to FIG. 8E, holes may be formed to penetrate a portion of the fourth insulating layer 104, and pad patterns 140 may be formed in the holes. The pad pattern 140 may be in contact with the third redistribution pattern 130.

Connection terminals 400, a first passive device 410 and a second passive device 420 may be formed on the pad patterns 140. The connection terminal 400 may include a solder, a bump, a pillar, and/or any combination thereof. The connection terminal 400 may include a solder material. Each of the first passive device 410 and the second passive device 420 may be, for example, a capacitor, an inductor, or a resistor. For example, each of the first passive device 410 and the second passive device 420 may be the capacitor.

Conductive terminals 402 may be disposed between the first passive device 410 and the second surface 100b of the redistribution substrate 100 and between the second passive device 420 and the second surface 100b of the redistribution substrate 100. The conductive terminals 402 may be elongated in the first direction D1.

Figure 8F:
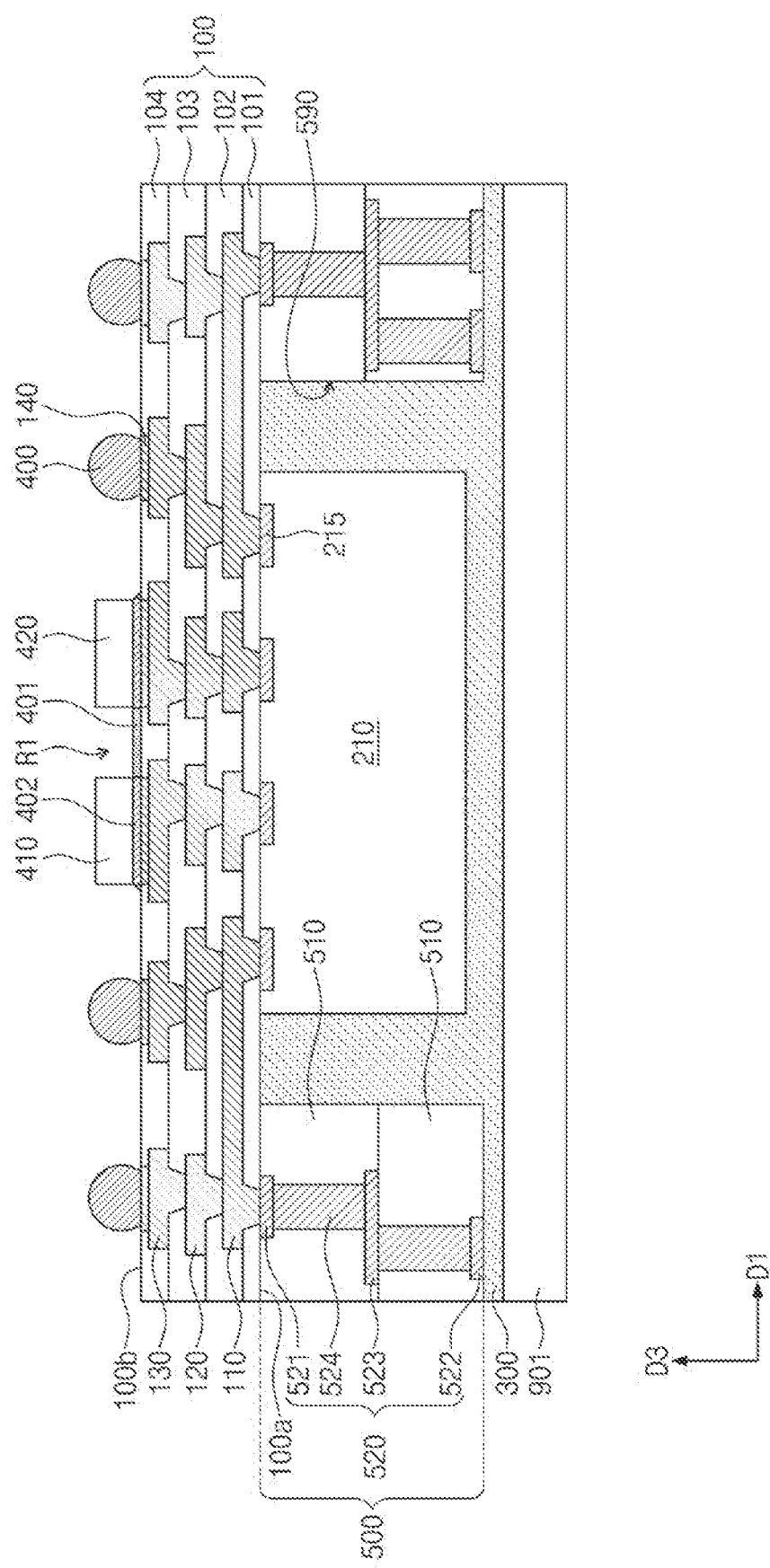

Referring to FIG. 8F, an underfill material may be discharged into a first region R1 between the first passive device 410 and the second passive device 420 to form an underfill layer 401. The underfill layer 401 may include a material having high spreadability, such as an Ajinomoto build-up film (ABF) or an epoxy-based polymer. Since the underfill layer 401 is formed, it is possible to prevent a crack from occurring in the passive devices having relatively thin thicknesses.

The underfill layer 401 may extend in the first direction D1 to be disposed between the first passive device 410 and the redistribution substrate 100 and between the second passive device 420 and the redistribution substrate 100. For example, the single underfill layer 401 may be shared by the first passive device 410 and the second passive device 420.

Since the first passive device 410 and the second passive device 420 are disposed adjacent to each other, the underfill material may be discharged into the region between the first passive device 410 and the second passive device 420, and thus the first and second passive devices 410 and 420 may share the single underfill layer 401. For example, according to the embodiments, the number of a process of discharging the underfill layer 401 may be reduced. As a result, processes of manufacturing a semiconductor package may be more simplified.

Referring again to FIG. 1, a structure obtained by removing the second carrier substrate 901 from the resultant structure of FIG. 8F may be flipped, and then, an upper redistribution layer 600 may be formed on the molding layer 300 of the flipped structure. The formation of the upper redistribution layer 600 may include forming upper redistribution patterns 620 and upper insulating patterns 610.

Figure 9:
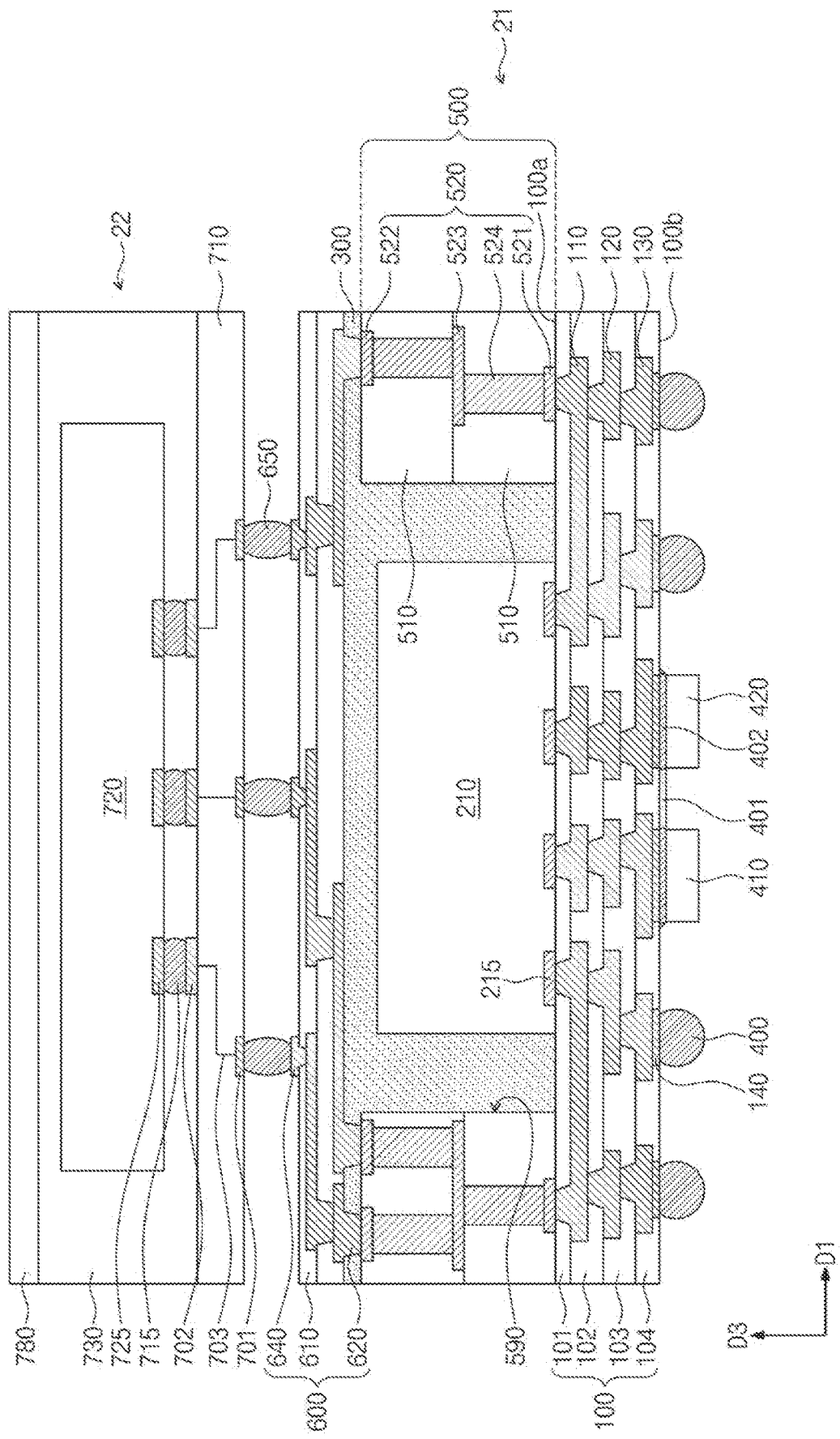
FIG. 9 is a cross-sectional view illustrating a semiconductor package according to embodiments.

FIG. 9 is a cross-sectional view illustrating a semiconductor package according to embodiments. In the embodiments, for the purpose of ease and convenience in explanation, the descriptions to the same features and/or components as in the embodiments of FIGS. 1 to 4 will be omitted and differences between the embodiments and the embodiments of FIGS. 1 to 4 will be mainly described.

Referring to FIG. 9, a semiconductor package may include a lower semiconductor package 21 and an upper semiconductor package 22. The lower semiconductor package 21 may include a redistribution substrate 100, connection terminals 400, a first passive device 410, a second passive device 420, an underfill layer 401, a semiconductor chip 210, a molding layer 300, a connection substrate 500, and an upper redistribution layer 600. The redistribution substrate 100, the connection terminals 400, the first passive device 410, the second passive device 420, the underfill layer 401, the semiconductor chip 210, the molding layer 300 and the connection substrate 500 may be substantially the same as described with reference to FIGS. 1 to 4.

The upper redistribution layer 600 may include an upper bonding pad 640. The upper bonding pad 640 may be disposed at an uppermost one of the upper insulating patterns 610 and may be connected to the upper redistribution patterns 620. The upper bonding pad 640 may be electrically connected to the connection terminals 400 and the semiconductor chip 210 through the upper redistribution patterns 620 and the conductive structure 520. Since the upper redistribution patterns 620 are provided, the upper bonding pad 640 may not be vertically aligned with the conductive structure 520.

The upper semiconductor package 22 may be disposed on the lower semiconductor package 21. For example, the upper semiconductor package 22 may be disposed on the upper redistribution layer 600. The upper semiconductor package 22 may include an upper substrate 710, an upper semiconductor chip 720, and an upper molding layer 730. The upper substrate 710 may be a printed circuit board. According to another embodiment, the upper substrate 710 may be a redistribution layer. For example, the upper substrate 710 may be manufactured by substantially the same method as the redistribution substrate 100 described with reference to FIGS. 8A to 8D. A first connection pad 701 and a second connection pad 702 may be disposed on a bottom surface and a top surface of the upper substrate 710, respectively. An interconnection line 703 may be provided in the upper substrate 710 and may be connected to the first connection pad 701 and the second connection pad 702. The interconnection line 703 is schematically illustrated, but a shape and arrangement of the interconnection line 703 may be variously modified. The first connection pad 701, the second connection pad 702 and the interconnection line 703 may include a conductive material such as a metal.

The upper semiconductor chip 720 may be disposed on the upper substrate 710. The upper semiconductor chip 720 may include integrated circuits, and the integrated circuits may include a memory circuit, a logic circuit, or a combination thereof. A kind of the upper semiconductor chip 720 may be different from a kind of the semiconductor chip 210. A bump terminal 715 may be disposed between the upper substrate 710 and the upper semiconductor chip 720 and may be connected to the second connection pad 702 and an upper chip pad 725 of the upper semiconductor chip 720. The upper semiconductor chip 720 may be electrically connected to the first connection pad 701 through the bump terminal 715 and the interconnection line 703. Unlike FIG. 9, the bump terminal 715 may be omitted, and the upper chip pad 725 may be connected directly to the second connection pad 702.

The upper molding layer 730 may be provided on the upper substrate 710 to cover the upper semiconductor chip 720. The upper molding layer 730 may include an insulating polymer such as an epoxy-based polymer.

The upper semiconductor package 22 may further include a heat dissipation structure 780. The heat dissipation structure 780 may include a heat sink, a heat slug, and/or a thermal interface material (TIM) layer. The heat dissipation structure 780 may include, for example, a metal. The heat dissipation structure 780 may be disposed on a top surface of the upper molding layer 730. The heat dissipation structure 780 may further extend onto a side surface of the upper molding layer 730 and/or a side surface of the molding layer 300.

The semiconductor package may further include a bonding terminal 650. The bonding terminal 650 may be disposed between the upper bonding pad 640 and the first connection pad 701 and may be connected to the upper bonding pad 640 and the first connection pad 701. Thus, the upper semiconductor package 22 may be electrically connected to the semiconductor chip 210 and the connection terminals 400 through the bonding terminal 650. Electrical connection of the upper semiconductor package 22 may be electrical connection to the integrated circuits in the upper semiconductor chip 720.

In embodiments, the upper substrate 710 may be omitted, and the bonding terminal 650 may be connected directly to the upper chip pad 725 of the upper semiconductor chip 720. In this case, the upper molding layer 730 may be in direct contact with a top surface of the upper redistribution layer 600. In embodiments, the upper substrate 710 and the bonding terminal 650 may be omitted, and the upper chip pad 725 of the upper semiconductor chip 720 may be connected directly to the upper bonding pad 640.

Figure 10:
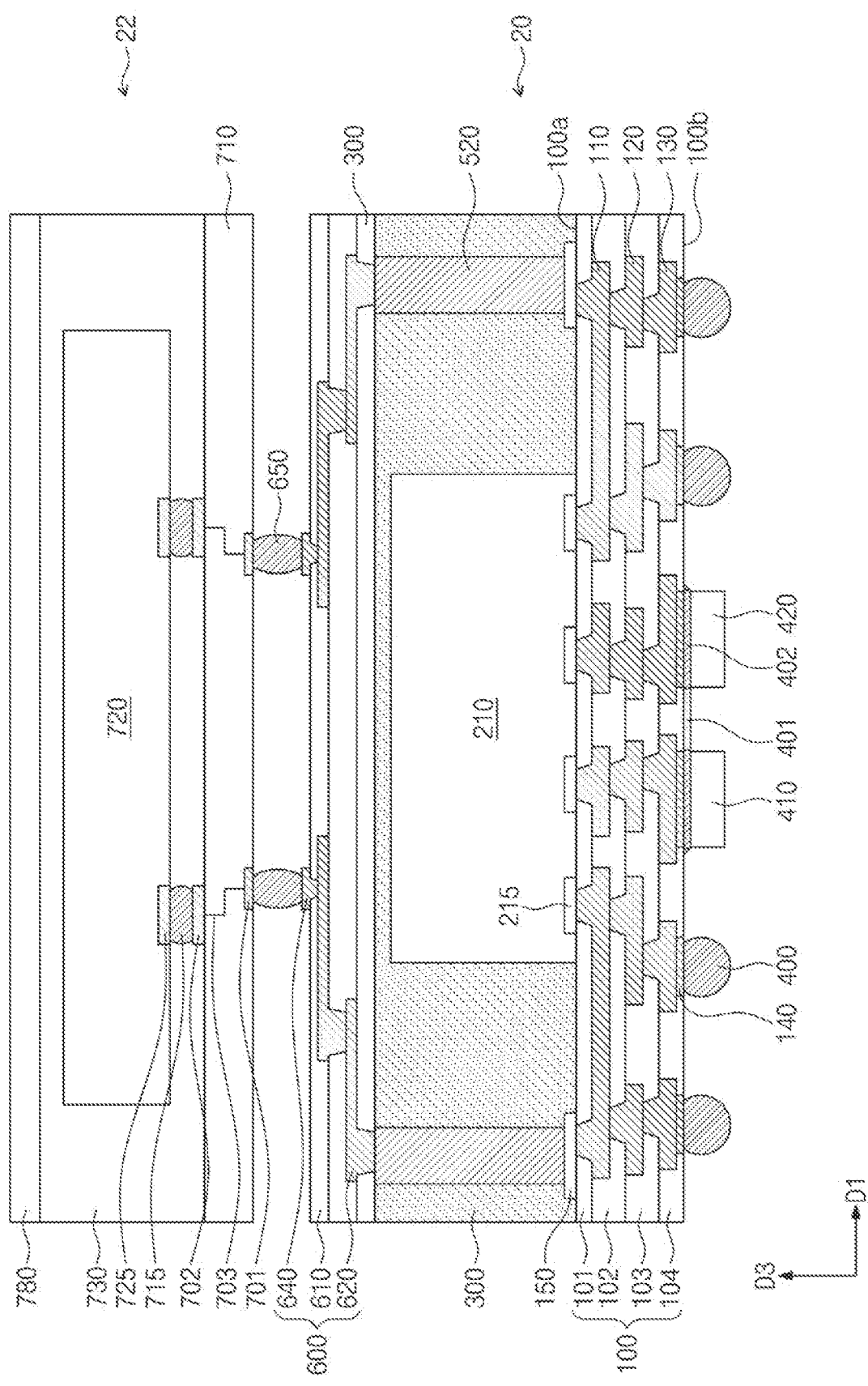
FIG. 10 is a cross-sectional view illustrating a semiconductor package according to embodiments.

FIG. 10 is a cross-sectional view illustrating a semiconductor package according to embodiments. In the embodiments, for the purpose of ease and convenience in explanation, the descriptions to the same features and/or components as in the embodiments of FIGS. 1 to 4 will be omitted and differences between the embodiments and the embodiments of FIGS. 1 to 4 will be mainly described.

Referring to FIG. 10, a semiconductor package may include a lower semiconductor package 20 and an upper semiconductor package 22. The lower semiconductor package 20 may include a redistribution substrate 100, connection terminals 400, a first passive device 410, a second passive device 420, an underfill layer 401, a semiconductor chip 210, a molding layer 300, and a conductive structure 520. The redistribution substrate 100, the connection terminals 400, the first passive device 410, the second passive device 420, the underfill layer 401, the semiconductor chip 210 and the molding layer 300 may be substantially the same as described with reference to FIGS. 1 to 4.

A lower bonding pad 150 may be disposed on the first surface 100a of the redistribution substrate 100. The lower bonding pad 150 may be spaced apart from the semiconductor chip 210. The lower bonding pad 150 may be in contact with the first redistribution pattern 110.

The conductive structure 520 may be disposed on the first surface 100a of the redistribution substrate 100. The conductive structure 520 may be in contact with the lower bonding pad 150. The conductive structure 520 may be electrically connected to the first redistribution pattern 110 through the lower bonding pad 150. The conductive structure 520 may be spaced apart from the semiconductor chip 210. The conductive structure 520 may be provided on an edge region of the redistribution substrate 100 when viewed in a plan view. A metal pillar may be provided on the redistribution substrate 100 to form the conductive structure 520. For example, the conductive structure 520 may be the metal pillar. The conductive structure 520 may be electrically connected to the redistribution substrate 100. For example, the conductive structure 520 may be electrically connected to the semiconductor chip 210 or the connection terminal 400 through the redistribution substrate 100. The conductive structure 520 may include a metal (e.g., copper).

The molding layer 300 may be disposed on the redistribution substrate 100 to cover the semiconductor chip 210. The molding layer 300 may be provided adjacent to and cover a side surface of the conductive structure 520. The molding layer 300 may be disposed between the semiconductor chip 210 and the conductive structure 520. The molding layer 300 may expose a top surface of the conductive structure 520.

The upper semiconductor package 22 may be disposed on the lower semiconductor package 20. The upper semiconductor package 22 may be substantially the same as the upper semiconductor package 22 described with reference to FIG. 9.

According to the embodiments, the first and second passive devices adjacent to each other may share the single underfill layer. Thus, even though the underfill layer including the material having the high spreadability is used, it is possible to reduce the distances between the first and second passive devices and the connection terminals closest thereto. As a result, it may be easier to miniaturize the semiconductor package.

Even though the distances between the first and second passive devices and the connection terminals closest thereto are reduced, the underfill layer may extend along the first passive device and the second passive device, and thus the connection terminals may not be in contact with the underfill layer. As a result, the electrical characteristics of the semiconductor package may be improved.

According to embodiments, even though a component (e.g., the spacer) for preventing the spread of the underfill layer is not added, it is possible to prevent the underfill layer from being in contact with the connection terminal. In addition, since the first passive device and the second passive device are disposed adjacent to each other, the underfill material may be discharged into the region between the first passive device and the second passive device, and thus the single underfill layer may be shared by the first and second passive devices. According to the embodiments, the number of the processes of discharging the underfill layer may be reduced in the processes of manufacturing the semiconductor package. As a result, the processes of manufacturing the semiconductor package may be more simplified.

While example embodiments have been described with reference to the figures, it will be understood by those of ordinary skill in the art that various changes in form and details may be made therein without departing from the spirit and scope as defined by the following claims and their equivalents.

What is claimed is:

1. A semiconductor package comprising:
   a redistribution substrate;
   a semiconductor chip on a top surface of the redistribution substrate;
   a first passive device and a second passive device on a bottom surface of the redistribution substrate and spaced apart from each other in a first direction;
   connection terminals on the bottom surface of the redistribution substrate; and
   an underfill layer between the first passive device and the redistribution substrate and between the second passive device and the redistribution substrate, the underfill layer intersecting a region between the first passive device and the second passive device and extending in the first direction,
   wherein the bottom surface of the redistribution substrate is exposed between the first passive device and a first connection terminal, among the connection terminals, which is closest to the first passive device in the first direction, and between the second passive device and a second connection terminal, among the connection terminals, which is closest to the second passive device in an opposite direction to the first direction, and
   wherein the underfill layer extends from a side surface of the first passive device to a side surface of the second passive device facing the side surface of the first passive device.

2. The semiconductor package of claim 1, wherein a distance between the first passive device and the second passive device ranges from 200 μm to 600 μm.

3. The semiconductor package of claim 1, wherein a distance between the first passive device and the first connection terminal ranges from 200 μm to 600 μm.

4. The semiconductor package of claim 1, further comprising:
   a connection substrate on the top surface of the redistribution substrate,
   wherein the connection substrate has a cavity region penetrating the connection substrate, and
   wherein the semiconductor chip is in the cavity region.

5. The semiconductor package of claim 1, wherein each of the first passive device and the second passive device comprises:
   a first surface extending in a second direction intersecting the first direction;
   a second surface opposite to the first surface; and
   third surfaces extending in the first direction,
   wherein the first surface of the first passive device and the first surface of the second passive device face each other,
   wherein a width of each of the third surfaces is greater than a width of the first surface, and
   wherein the underfill layer is offset from the third surfaces of the first passive device and the third surfaces of the second passive device in the second direction when viewed in a plan view.

6. The semiconductor package of claim 5, wherein the underfill layer has side surfaces exposed by the second surface of the first passive device and the second surface of the second passive device.

7. The semiconductor package of claim 5, wherein the underfill layer extends from the second surface of the first passive device to the second surface of the second passive device.

8. The semiconductor package of claim 5, further comprising:
   conductive terminals between the first passive device and the bottom surface of the redistribution substrate,
   wherein the conductive terminals are adjacent to the third surfaces of the first passive device and extend in the first direction.

9. The semiconductor package of claim 8, wherein the underfill layer is between the conductive terminals.

10. The semiconductor package of claim 1, further comprising:
    a third passive device spaced apart from the first passive device and the second passive device in a second direction intersecting the first direction,
    wherein the underfill layer further comprises a protrusion which extends to the third passive device in the second direction and is between the third passive device and the redistribution substrate.

11. A semiconductor package comprising:
    a redistribution substrate comprising an insulating layer and redistribution patterns in the insulating layer;
    a semiconductor chip on a top surface of the redistribution substrate, the semiconductor chip comprising chip pads electrically connected to the redistribution patterns;
    a molding layer on the semiconductor chip;
    a first passive device and a second passive device on a bottom surface of the redistribution substrate and spaced apart from each other in a first direction;
    connection terminals on the bottom surface of the redistribution substrate;

pad patterns between the connection terminals and the redistribution patterns;

conductive terminals between the first passive device and the bottom surface of the redistribution substrate and between the second passive device and the bottom surface of the redistribution substrate in a second direction perpendicular to the first direction, the conductive terminals extending the first direction; and an underfill layer between the first passive device and the redistribution substrate and between the second passive device and the redistribution substrate, the underfill layer intersecting a region between the first passive device and the second passive device and extending in the first direction, wherein the bottom surface of the redistribution substrate is exposed between the first passive device and a first connection terminal, among the connection terminals, which is closest to the first passive device in the first direction, and between the second passive device and a second connection terminal, among the connection terminals, which is closest to the second passive device in an opposite direction to the first direction, and wherein the underfill layer is between the conductive terminals in the first direction.

12. The semiconductor package of claim 11, wherein each of the first passive device and the second passive device comprises:

a first surface extending in a second direction intersecting the first direction;

a second surface opposite to the first surface; and third surfaces extending in the first direction, wherein the first surface of the first passive device and the first surface of the second passive device face each other, wherein a width of each of the third surfaces is greater than a width of the first surface, and wherein the underfill layer is offset from the third surfaces of the first passive device and the third surfaces of the second passive device in the second direction when viewed in a plan view.

13. The semiconductor package of claim 12, wherein the underfill layer extends from the second surface of the first passive device to the second surface of the second passive device.

14. The semiconductor package of claim 11, wherein a height of the first passive device is less than a height of each of the connection terminals.

* * * * *